(12) United States Patent
Kimura et al.

(10) Patent No.: US 6,579,468 B2
(45) Date of Patent: Jun. 17, 2003

(54) PIEZOELECTRIC CERAMIC COMPOSITION, PIEZOELECTRIC CERAMIC ELEMENT, AND METHOD FOR MANUFACTURING THE PIEZOELECTRIC CERAMIC COMPOSITION

(75) Inventors: Masahiko Kimura, Kusatsu (JP); Akira Ando, Omihachiman (JP); Tomoyuki Ogawa, Shiga-ken (JP)

(73) Assignee: Murata Manufacturing Co. Ltd. (JP)

(*) Notice: Subject to any disclaimer, the term of this patent is extended or adjusted under 35 U.S.C. 154(b) by 0 days.

(21) Appl. No.: 10/158,640

(22) Filed: May 29, 2002

(65) Prior Publication Data

US 2003/0071240 A1 Apr. 17, 2003

(30) Foreign Application Priority Data

May 29, 2001 (JP) .......................... 2001-159867
Apr. 2, 2002 (JP) .......................... 2002-099586

(51) Int. Cl.[7] .................. H01L 41/00; C04B 35/495; C04B 35/499
(52) U.S. Cl. .................. 252/62.9 R; 252/62.9 PZ; 501/134; 501/135; 501/136; 501/137; 501/138; 501/139
(58) Field of Search .................. 252/62.9 R, 62.9 PZ; 501/134, 135, 136, 137, 138, 139

(56) References Cited

U.S. PATENT DOCUMENTS 6,083,415 A * 7/2000 Kimura et al. ......... 252/62.9 R
6,093,339 A * 7/2000 Kimura et al. ......... 252/62.9 R

* cited by examiner

Primary Examiner—Elizabeth D. Wood
(74) Attorney, Agent, or Firm—Dickstein, Shapiro, Morin & Oshinsky, LLP

(57) ABSTRACT

A piezoelectric ceramic composition contains a compound containing Na, Li, Nb and O, and having a perovskite structure, as a main component. The main component has a crystal phase in a semi-stable state at room temperature, such crystal phase originally not being stable at room temperature but being stable at a higher temperature.

20 Claims, 3 Drawing Sheets

PIEZOELECTRIC CERAMIC COMPOSITION, PIEZOELECTRIC CERAMIC ELEMENT, AND METHOD FOR MANUFACTURING THE PIEZOELECTRIC CERAMIC COMPOSITION

BACKGROUND OF THE INVENTION

1. Field of the Invention

The present invention relates to piezoelectric ceramic compositions, piezoelectric ceramic elements, and a method for manufacturing the piezoelectric ceramic compositions. The present invention particularly relates to a piezoelectric ceramic composition adapted to a material for piezoelectric ceramic elements such as piezoelectric ceramic filters piezoelectric ceramic oscillators, and piezoelectric ceramic resonators, and to a piezoelectric ceramic device using the same.

2. Description of the Related Art

Piezoelectric ceramic compositions containing lead zirconate titanate ($Pb(Ti_xZr_{1-x})O_3$) or lead titanate ($PbTiO_3$) as a main component are widely used for piezoelectric ceramic elements such as piezoelectric ceramic filters, piezoelectric ceramic oscillators and piezoelectric ceramic resonators. Since piezoelectric ceramic compositions containing lead zirconate titanate or lead titanate as a main component contain a large amount of lead, there is a problem in that the uniformity of products deteriorates because of the vaporization of lead oxide in the manufacturing process. In order to prevent this above problem, a piezoelectric ceramic composition containing no lead or a small amount of lead is used.

Since other piezoelectric ceramic compositions containing a series of compounds represented by formula $(Na_{1-x}Li_x)NbO_3$ as a main component do not contain lead oxide, the above-mentioned problem does not arise. However, the $(Na_{1-x}Li_x)NbO_3$ piezoelectric ceramic compositions provide products having a small mechanical quality factor $Q_m$. Thus, there is a problem in that it is difficult to use such piezoelectric ceramic compositions in, for example, piezoelectric ceramic filters requiring a high mechanical quality factor $Q_m$.

Since morphotropic transformation from a crystalline phase stable at room temperature to another crystalline phase stable at a temperature higher than a room temperature occurs at a relatively low temperature, there is a problem in that the resonance frequency changes significantly at the morphotropic transformation temperature in the $(Na_{1-x}Li_x)NbO_3$ piezoelectric ceramic compositions.

SUMMARY OF THE INVENTION

Accordingly, it is an object of the present invention to provide a piezoelectric ceramic composition containing compounds represented by formula $(Na_{1-x}Li_x)NbO_3$ and having a perovskite structure as a main component, wherein the piezoelectric ceramic composition provides a product having a higher mechanical quality factor $Q_m$.

It is another object of the present invention to provide a piezoelectric ceramic element using the piezoelectric ceramic composition containing compounds represented by formula $(Na_{1-x}Li_x)NbO_3$ and having a perovskite structure as a main component, wherein the piezoelectric ceramic element has an increased mechanical quality factor $Q_m$.

It is another object of the present invention to provide a method for manufacturing a piezoelectric ceramic composition containing a compound represented by formula $(Na_{1-x}Li_x)NbO_3$ and having a perovskite structure as a main component, wherein the piezoelectric ceramic composition provides a product having an increased mechanical quality factor $Q_m$.

The present invention provides a piezoelectric ceramic composition including a compound mainly containing Na, Li, Nb and O and having a perovskite structure, as a main component, wherein the main component has a crystal phase in a semi-stable state at room temperature, the crystal phase originally not being stable at room temperature but being stable at a higher temperature.

In the piezoelectric ceramic composition according to the present invention, the crystal phase, which is stable at a higher temperature than room temperature, has a monoclinic form.

In the piezoelectric ceramic composition according to the present invention, the compound is preferably represented by formula $(Na_{1-x}Li_x)NbO_3$ wherein $0.02 \leq x \leq 0.3$, and more preferably $0.08 \leq x \leq 0.18$.

In the piezoelectric ceramic composition according to the present invention, the compound may be of formula

wherein $0.02 \leq x \leq 0.3$, $0 \leq y \leq 0.2$, $0 \leq z \leq 0.2$, $0 \leq n \leq 0.1$, M1 represents a bivalent metal element and M2 represents a tetravalent metal element. The bivalent metal element can be at least one selected from the group consisting of Mg, Ca, Sr and Ba, and the tetravalent metal element can be at least one selected from the group consisting of Ti, Zr, Sn, and Hf.

The present invention provides a piezoelectric ceramic device having electrodes used for the piezoelectric ceramic and a piezoelectric ceramic including the piezoelectric ceramic composition.

The present invention provides a method for manufacturing the piezoelectric ceramic composition having the steps of polarizing an untreated piezoelectric ceramic composition, and heating the polarized piezoelectric ceramic composition at a temperature equal to or higher than the temperature at which the crystal phase is in a stable state but lower than a temperature at which the compound does not have ferroelectricity.

In the method for manufacturing a piezoelectric ceramic composition, the temperature to which the polarized piezoelectric ceramic composition is heated is preferably within the range of about 250–400° C.

The present invention provides a piezoelectric ceramic composition containing a compound containing Na, Li, Nb, and O and having a perovskite structure, as a main component, wherein the compound is represented by formula $(Na_{1-x}Li_x)NbO_3$. The piezoelectric ceramic composition contains no lead sand has an increased mechanical quality factor $Q_m$. Thus, the piezoelectric ceramic composition is adapted to piezoelectric ceramic elements such as piezoelectric ceramic filters, piezoelectric ceramic oscillators and piezoelectric ceramic resonators. The present invention further provides a piezoelectric ceramic device including the piezoelectric ceramic composition.

The piezoelectric ceramic composition according to the present invention has a crystal phase in a semi-stable state at room temperature and which is stable at temperatures higher than room temperature. Accordingly, morphotropic transformation in the piezoelectric ceramic composition does not occur at the morphotropic transformation temperature and, thus, the resonance frequency does not change significantly.

DESCRIPTION OF THE PREFERRED EMBODIMENTS

Figure 1:
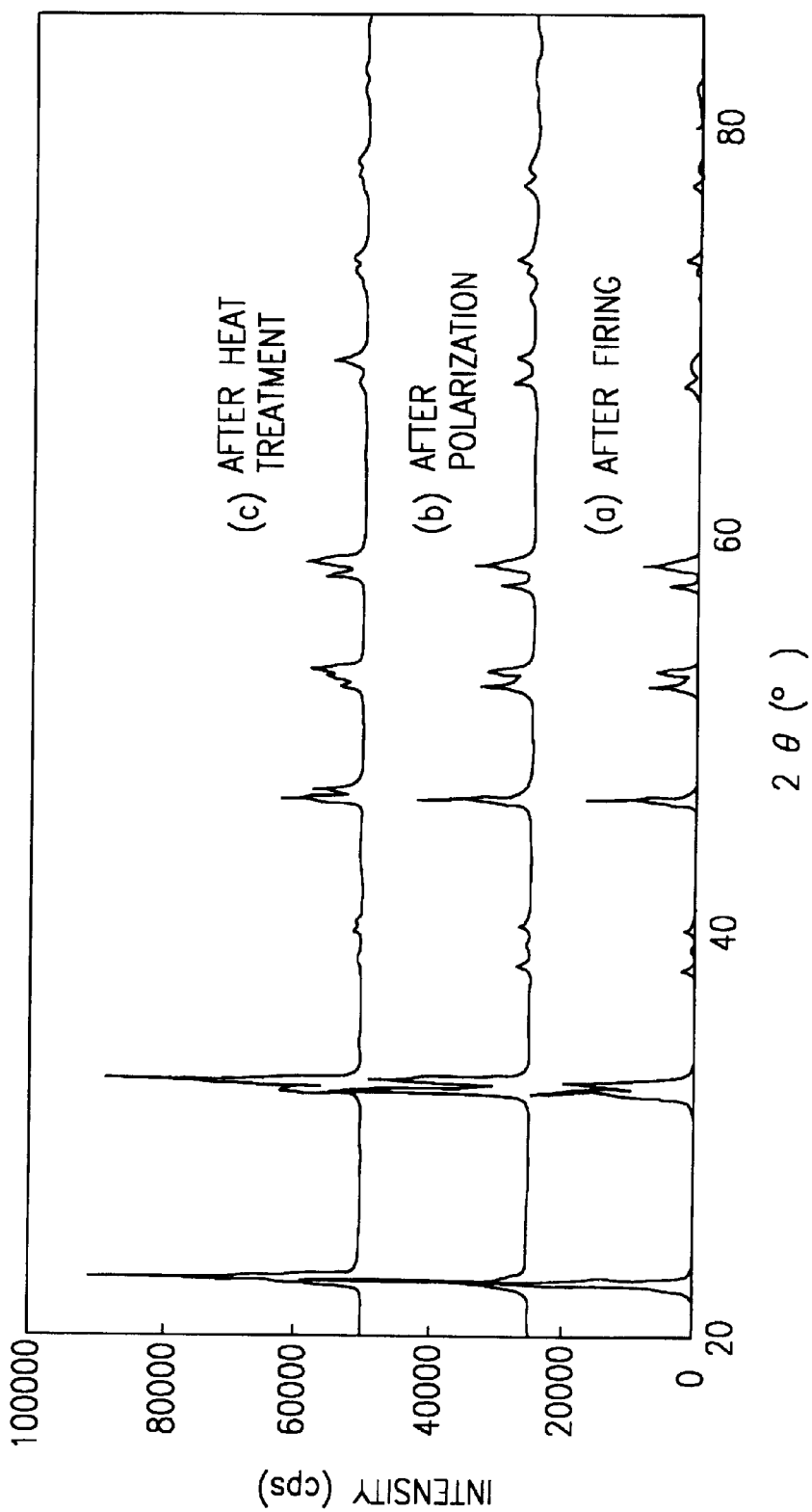
FIG. 1 is a graph showing the X-ray diffraction pattern of a compound represented by formula $(Na_{0.87}Li_{0.13})NbO_3$.

The objects described above and others, the characteristic features, and the advantages of the present invention will become clearer by the embodiments described below with reference to the drawings.

In the piezoelectric ceramic composition containing compounds represented by formula $(Na_{1-x}Li_x)NbO_3$ and having a perovskite structure as a main component, the main component according to the present invention has a crystalline phase in a semi-stable state at room temperature, wherein the crystalline phase was not originally stable at room temperature, and is stable at temperatures higher than room temperature. In this description, the semi-stable state is defined as a state in which the original high temperature crystalline phase of a material is maintained in a non-equilibrium state for a extremely long period and is not transformed to another crystalline phase at the morphotropic transformation temperature in the process of changing the temperature of the material. For example, it is known that the tetragonal form of barium titanate ($BaTiO_3$) is originally stable at room temperature and the hexagonal form can be obtained at room temperature by quenching barium titanate from a high temperature of 1,460° C. In this instance, the semi-stable state means a state in which the hexagonal form of barium titanate is maintained at room temperature. The semi-stable state is not created during the process of increasing the temperature but arises in the process of reducing the temperature. That is, the semi-stable state means that a crystal phase originally stable at a higher temperature appears at room temperature.

In a disk piezoelectric ceramic resonator operating in a thickness longitudinal vibration mode using a piezoelectric ceramic composition containing compounds represented by formula $(Na_{1-x}Li_x)NbO_3$ and having a perovskite structure as a main component, the mechanical quality factor $Q_m$ is improved from, for example, about 500 to at least 1,000 according to the above method.

Since the original stable at a higher temperature than room temperature crystal phase is maintained at room temperature(the semi-stable state), a morphotropic transformation does not occur at the morphotropic transformation temperature; hence the resonance frequency does not change significantly In the piezoelectric ceramic composition according to the present invention.

In view of the effects of the present invention, the main component of the piezoelectric ceramic composition according to the present invention is preferably a compound containing Na, Li, Nb and O mainly and having a perovskite structure, the compound being represented by formula $(Na_{1-x}Li_x)NbO_3$, wherein $0.02 \leq x \leq 0.3$, and preferably $0.08 \leq x \leq 0.18$. Another piezoelectric ceramic composition of the invention is represented by the following formula may be used: $(1-n)[(Na_{1-x}Li_x)_{1-y}K_y](Nb_{1-z}Ta_z)O_3-nM1M2O_3$, wherein $0.02 \leq x \leq 0.3$, $0 \leq y \leq 0.2$, $0 \leq z \leq 0.2$, $0 \leq n \leq 0.1$, M1 represents a bivalent metal element and M2 represents a tetravalent metal element. In the above compound, M1 is preferably at least one selected from the group consisting of Mg, Ca, Sr and Ba. M2 is preferably at least one selected from the group consisting of Ti, Zr, Sn and Hf.

In the compound represented by formula $(Na_{1-x}Li_x)NbO_3$, the values of Na, Li, Nb, and O may deviate from stoichiometric values by about 5% according to the present invention. The piezoelectric ceramic composition according to the present invention may also contain Al, Mn, Fe, Si, Co, and Pb within a range of several percentages.

An exemplary method for manufacturing the piezoelectric ceramic composition according to the present invention is as follows: the piezoelectric ceramic composition is polarized, and then heated to a temperature which is equal to or higher than temperature at which the crystal phase is stable and which is less than a temperature at which the material does not have ferroelectricity. The piezoelectric ceramic composition is preferably heated to a temperature between about 250° C. to 400° C.

EXAMPLES

Samples were prepared according to the following procedures. The following compounds were used as starting materials: $Na_2CO_3$, $Li_2CO_3$, $K_2CO_3$, $Nb_2CO_3$, $Ta_2O_5$, $CaCO_3$, $BaCO_3$, $TiO_2$, and $ZrO_2$. The starting materials were weighed to satisfy the following formula: $(1-n)[(Na_{1-x}Li_x)_{1-y}K_y](Nb_{1-z}Ta_z)O_3-nM1M2O_3$, wherein $0.01 \leq x \leq 0.35$, $0 \leq y \leq 0.25$, $0 \leq z \leq 0.25$, $0 \leq n \leq 0.2$, M1 represents Ca or Ba, and M2 represents Ti or Zr. The weighed starting materials were mixed by wet-mixing with a ball mill for 16 hours. The resulting mixtures were dried and calcined at 700° C. to 900° C. to obtain calcines. The calcines were roughly ground and then wet-ground with a ball mill for 16 hours by adding a proper amount of an organic binder. The ground calcines were sieved with a 40-mesh screen to obtain granules passing through the 40-mesh screen. The resulting granules were molded at a pressure of 1,500 kg/cm² to form disks each having a diameter of 12 mm and a thickness of 0.6 mm. The resulting disks were then fired at 1,000–1,300° C. in air to obtain disk ceramics. A silver paste was applied onto both main surfaces of the disk ceramics and then fired by a known method to form silver electrodes. The resulting disk ceramics were polarized by applying a direct voltage of 3–10 kV/mm for 30–60 minutes in an insulating oil having a temperature of 100–250° C. to obtain piezoelectric ceramics. The resulting samples were then heated at 150–500° C.

FIG. 1, part (a) shows a X-ray diffraction pattern of a powder at room temperature, the powder being prepared by grinding the disk ceramic of sample No. 7 having a composition represented by formula $Na_{0.87}Li_{0.13})NbO_3$, which does not have electrodes and is not polarized. FIG. 1, part (b) shows another X-ray diffraction pattern at room temperature of another powder have the same composition where electrodes were formed on the disk ceramic, followed by polarizing the resulting disk ceramic and removing the electrodes before grinding the resulting disk ceramic. The patterns shown in a and b of FIG. 1 are substantially the same. According to analysis of the inventors, the patterns shown in a and b of FIG. 1 show a rhombohedral form.

FIG. 1, part (c) shows another room temperature X-ray diffraction pattern of another powder of the same composition, prepared by forming electrodes on the disk ceramic, polarizing the resulting disk ceramic, heating the resulting disk ceramic to 350° C., cooling the same to room temperature, removing the electrodes and then grinding the resulting disk ceramic.

The pattern shown in c of FIG. 1 is obviously different from those shown in a and b. With respect to the peaks between 35 and 45 degrees (2θ), the former (c) pattern is obviously different from the latter (a) and (b) ones. According to analysis of the inventors, the pattern shown in (c) is of a monoclinic form.

The peaks between 35 and 45 degrees (2θ) in (c) of FIG. 1 correspond to those of a crystal phase which is stable at 200–350° C. This information is obtained from the X-ray diffraction patterns of another powder prepared by grinding another disk ceramic having the same formula and not having electrodes, wherein the X-ray diffraction is performed at different temperatures.

In the above ceramics, the rhombohedral form appears at room temperature after polarization and a monoclinic form appears at room temperature after heat treatment at 350° C. That is, when performing heat treatment after polarization, the crystal phase originally stable at high temperature is in a semi-stable state.

In another experiment, one of the ceramics was prepared by performing a heat treatment after polarization and stored for two months, after which X-ray diffraction was performed. The X-ray diffraction pattern obtained was same as that obtained two months earlier.

For other compounds within the scope of the present invention, the crystalline phases of the compounds were researched before and after heat treatment, wherein the compounds have the following formula: $(1-n)[(Na_{1-x}Li_x)_{1-y}K_y](Nb_{1-z}Ta_z)O_3 \cdot nM1M2O_3$, wherein $0.02 \leq x \leq 0.30$, $0 \leq y \leq 0.2$, $0 \leq z \leq 0.2$, $0 \leq n \leq 0.1$, M1 represents a bivalent metal element and M2 represents a tetravalent metal element. Substantially the same results as those of the above experiments were obtained. As a result, it became clear that the mechanical quality factor $Q_m$ increases when the crystal phase in a semi-stable state is formed.

Tables 1 and 2 show the electromechanical coefficient kτ and the mechanical quality factor $Q_m$ of untreated and heat-treated disk piezoelectric ceramic oscillators utilizing a fundamental wave in thickness longitudinal vibration.

TABLE 1

| Sample | M1 | M2 | x | Y | z | n | Heat Treating Temperature (° C.) | Before Heat Treatment Crystalline Phase | $K_r$ (%) | $Q_m$ | After Heat Treatment Crystalline Phase | $K_r$ (%) | $Q_m$ |
|---|---|---|---|---|---|---|---|---|---|---|---|---|---|
| 1 | — | — | 0.01 | 0 | 0 | 0 | 350 | Rhombohedral | 23 | 110 | Monoclinic | 18 | 1,000 |
| 2 | — | — | 0.02 | 0 | 0 | 0 | 350 | Rhombohedral | 25 | 190 | Monoclinic | 18 | 1,210 |
| 3 | — | — | 0.05 | 0 | 0 | 0 | 350 | Rhombohedral | 31 | 185 | Monoclinic | 25 | 1,280 |
| 4 | — | — | 0.08 | 0 | 0 | 0 | 350 | Rhombohedral | 36 | 320 | Monoclinic | 27 | 1,950 |
| 5* | — | — | 0.13 | 0 | 0 | 0 | 500 | Rhombohedral | 46 | 350 | Monoclinic | Cannot be measured | |
| 6 | — | — | 0.13 | 0 | 0 | D | 400 | Rhombohedral | 46 | 350 | Monoclinic | 30 | 2,060 |
| 7 | — | — | 0.13 | 0 | 0 | 0 | 350 | Rhombohedral | 46 | 350 | Monoclinic | 31 | 2,100 |
| 8 | — | — | 0.13 | 0 | 0 | 0 | 300 | Rhombohedral | 46 | 350 | Monoclinic | 40 | 1,850 |
| 9* | — | — | 0.13 | 0 | 0 | 0 | 150 | Rhombohedral | 46 | 350 | Rhombohedral | 46 | 350 |
| 10 | — | — | 0.18 | 0 | 0 | 0 | 350 | Rhombohedral | 39 | 385 | Monoclinic | 32 | 1,920 |
| 11 | — | — | 0.3 | 0 | 0 | 0 | 350 | Rhombohedral | 28 | 270 | Monoclinic | 20 | 1,230 |
| 12 | — | — | 0.35 | 0 | 0 | 0 | 350 | Rhombohedral | 18 | 190 | Monoclinic | 15 | 1,010 |
| 13 | — | — | 0.13 | 0.1 | 0 | 0 | 350 | Rhombohedral | 48 | 245 | Monoclinic | 33 | 1,710 |
| 14 | — | — | 0.13 | 0.2 | 0 | 0 | 350 | Rhombohedral | 36 | 225 | Monoclinic | 26 | 1,580 |
| 15 | — | — | 0.13 | 0.25 | 0 | 0 | 350 | Rhombohedral | 25 | 185 | Monoclinic | 23 | 1,210 |

The samples marked with an asterisk number are outside the scope of the present invention.

TABLE 2

| Sample | M1 | M2 | x | y | z | n | Heat Treating Temperature (° C.) | Before Heat Treatment Crystalline Phase | $K_r$ (%) | $Q_m$ | After Heat Treatment Crystalline Phase | $K_r$ (%) | $Q_m$ |
|---|---|---|---|---|---|---|---|---|---|---|---|---|---|
| 16 | — | — | 0.13 | 0 | 0.1 | 0 | 350 | Rhombohedral | 42 | 310 | Monoclinic | 37 | 1,810 |
| 17 | — | — | 0.13 | 0 | 0.2 | 0 | 350 | Rhombohedral | 38 | 250 | Monoclinic | 34 | 1,660 |
| 18 | — | — | 0.13 | 0 | 0.25 | 0 | 350 | Rhombohedral | 33 | 190 | Monoclinic | 25 | 1,380 |
| 19 | Ca | Ti | 0.13 | 0 | 0 | 0.05 | 350 | Rhombohedral | 45 | 320 | Monoclinic | 33 | 1,850 |
| 20 | Ca | Ti | 0.13 | 0 | 0 | 0.1 | 350 | Rhombohedral | 41 | 260 | Monoclinic | 25 | 1,530 |
| 21 | Ca | Ti | 0.13 | 0 | 0 | 0.2 | 350 | Rhombohedral | 30 | 180 | Monoclinic | 19 | 1,020 |
| 22 | Ba | Ti | 0.13 | 0 | 0 | 0.05 | 350 | Rhombohedral | 40 | 300 | Monoclinic | 30 | 1,770 |
| 23 | Ba | TI | 0.13 | 0 | 0 | 0.1 | 350 | Rhombohedral | 38 | 265 | Monoclinic | 26 | 1,430 |
| 24 | Ba | Ti | 0.13 | 0 | 0 | 0.2 | 350 | Rhombohedral | 30 | 190 | Monoclinic | 19 | 1,000 |
| 25 | Ca | Zr | 0.13 | 0 | 0 | 0.05 | 350 | Rhombohedral | 39 | 300 | Monoclinic | 30 | 1,720 |
| 26 | Ca | Zr | 0.13 | 0 | 0 | 0.1 | 350 | Rhombohedral | 36 | 240 | Monoclinic | 24 | 1,300 |
| 27 | Ca | Zr | 0.13 | 0 | 0 | 0.2 | 350 | Rhombohedral | 25 | 180 | Monoclinic | 16 | 1,040 |
| 28 | — | — | 0.13 | 0 | 0 | 0 | 250 | Rhombohedral | 46 | 350 | Monoclinic | 36 | 1,980 |

Among prepared ceramics having the same composition, the ceramic having the largest mechanical quality factor $Q_m$, wherein the ceramics were treated under different conditions (calcination temperature, firing temperature, temperature of an insulating oil during polarization, and the voltage of direct current) is shown in Tables 1 and 2 as sample 7.

Since Sample No. 5, heat-treated at an excessively high temperature, does not have ferroelectricity and piezoelectricity, it is outside the scope of the present invention. In Sample No. 9, the heat-treating temperature was lower than that at which the crystal phase is stable and the crystal phase is not transformed since the heat-treating temperature is excessively low; hence Sample No. 9 is outside the scope of the present invention.

As shown in Tables 1 and 2, samples within the scope of the present invention have an increased mechanical quality factor $Q_m$ after heat treatment. Thus, such materials are adapted to piezoelectric ceramic compositions used for piezoelectric ceramic elements such as piezoelectric ceramic filters, piezoelectric ceramic oscillators, and piezoelectric ceramic resonators.

Figure 2:
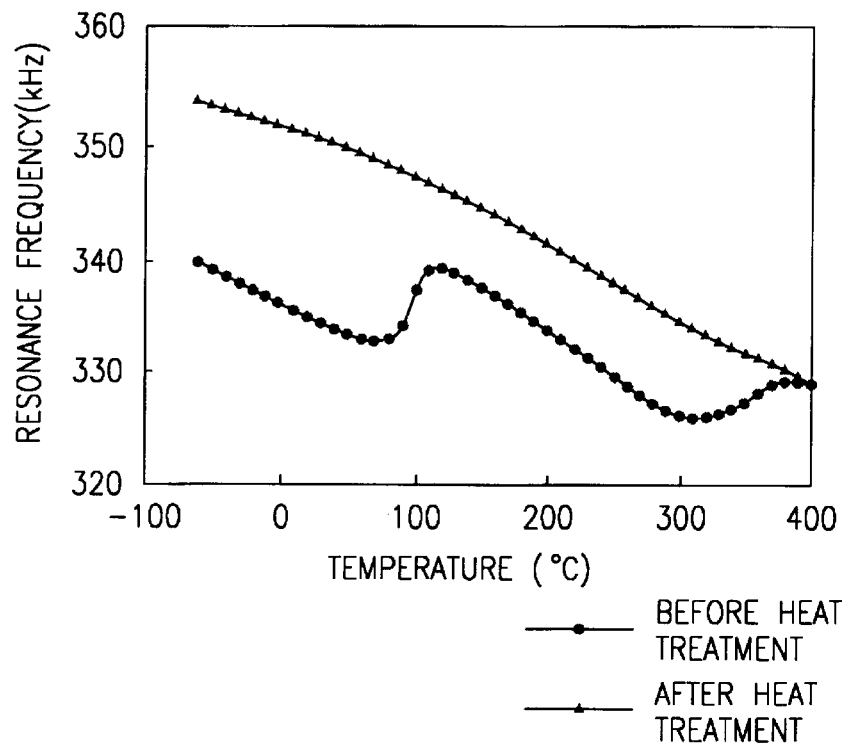
FIG. 2 is a graph showing changes in the resonance frequency with temperature in the spreading vibration of an untreated or heat-treated piezoelectric ceramic resonator comprising Sample No. 6 represented by formula $(Na_{0.87}Li_{0.13})NbO_3$.

The presence of significant changes in the resonance frequency (the occurrence of the morphotropic transformation) were researched. Table 3 shows the results of the measurement performed as follows: the resonance frequency in the spreading vibration for Samples No. 1 to 28 is measured with an impedance analyzer at a temperature of −40 to 400° C. to find significant changes in the resonance frequency, that is, the occurrence of the morphotropic transformation. FIG. 2 shows the relationship between the temperature and the resonance frequency which are obtained by using a piezoelectric ceramic resonator comprising untreated or heat-treated Sample No. 6.

TABLE 3

| Samples | Before Heat Treatment | After Heat Treatment |
| --- | --- | --- |
| 1 | Changes | No Changes |
| 2 | Changes | No Changes |
| 3 | Changes | No Changes |
| 4 | Changes | No Changes |
| 5* | | Cannot be measured |
| 6 | Changes | No Changes |
| 7 | Changes | No Changes |
| 8 | Changes | No Changes |
| 9* | Changes | Changes |
| 10 | Changes | No Changes |
| 11 | Changes | No Changes |
| 12 | Changes | No Changes |
| 13 | Changes | No Changes |
| 14 | Changes | No Changes |
| 15 | Changes | No Changes |
| 16 | Changes | No Changes |
| 17 | Changes | No Changes |
| 18 | Changes | No Changes |
| 19 | Changes | No Changes |
| 20 | Changes | No Changes |
| 21 | Changes | No Changes |
| 22 | Changes | No Changes |
| 23 | Changes | No Changes |
| 24 | Changes | No Changes |
| 25 | Changes | No Changes |
| 26 | Changes | No Changes |
| 27 | Changes | No Changes |
| 28 | Changes | No Changes |

Table 3 FIG. 2 show that there are significant changes in the resonance frequency of the morphotropic transformation) for every sample except Sample No. 5 before the heat treatment and for Sample No. 9 after the heat treatment. Sample No. 5 could not used for the measurement after heat treatment because of depolarization. None of the other samples exhibited significant changes in the resonance frequency after heat treatment. Thus, Samples No. 5 and 9 are outside the present invention.

FIG. 2 shows the changes in the resonance frequency with temperature of Sample No. 6. The line of heat-treated Sample No. 6 is linear while the line of untreated Sample No. 6 is not linear. Small changes in the resonance frequency with temperature are usually required for piezoelectric ceramic filters, piezoelectric ceramic oscillators and piezoelectric ceramic resonators. Since linear changes in the resonance frequency with temperature are readily reduced by correction, a material with this characteristic is adapted to the above uses. In contrast, nonlinear changes in the resonance frequency with temperature are not readily reduced by correction.

Furthermore, changes in the resonance frequency with temperature in untreated Sample No. 6 are different during the heating or cooling step, or according to the heating or cooling rate. That is, the changes in the resonance frequency with temperature depend on the thermal hysteresis. In contrast, heat-treated Sample No. 6 has linear changes in the resonance frequency with temperature within the range of −40 to 125° C., which are the ordinary temperatures encountered.

The piezoelectric ceramic composition according to the present invention is not limited to the embodiments and the examples described above, and within the scope of the present invention, various modifications and various changes may be performed.

In order to explain the advantages of the present invention, the mechanical quality factor $Q_m$ is described by using the thickness longitudinal vibration of a disk piezoelectric ceramic resonator in the above examples. The present invention is not limited to the examples and is applicable to other piezoelectric ceramic elements, for example, piezoelectric ceramic resonators utilizing a harmonic such as a spreading vibration, a thickness shear vibration and a thickness longitudinal.

In the above examples, the mechanical quality factor $Q_m$ is described by using the changes in the resonance frequency with temperature in a disk piezoelectric ceramic resonator. The present invention is not limited to the examples and is applicable to other piezoelectric ceramic elements utilizing a thickness shear vibration or a thickness longitudinal vibration.

Figure 3:
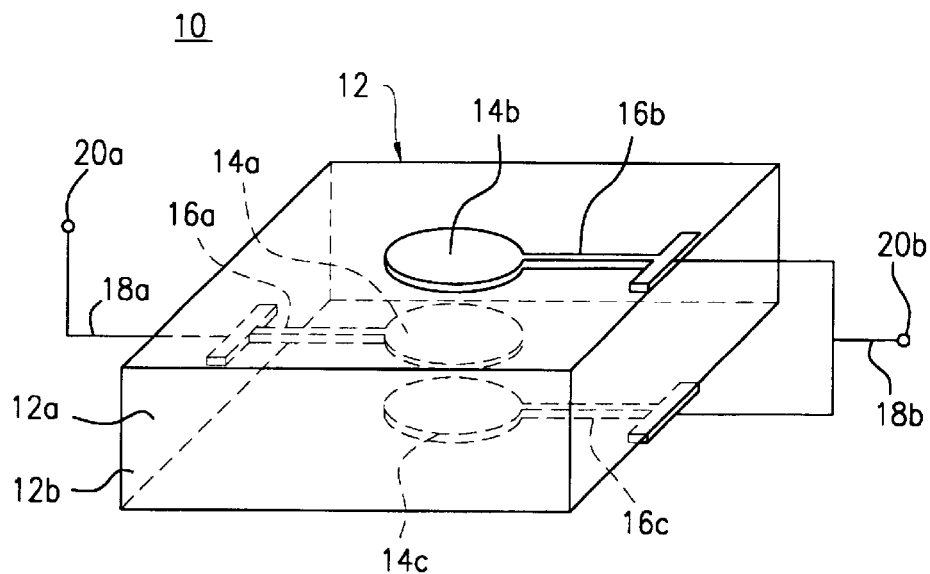
FIG. 3 is a plan view showing an exemplary piezoelectric ceramic resonator according to the present invention.
Figure 4:
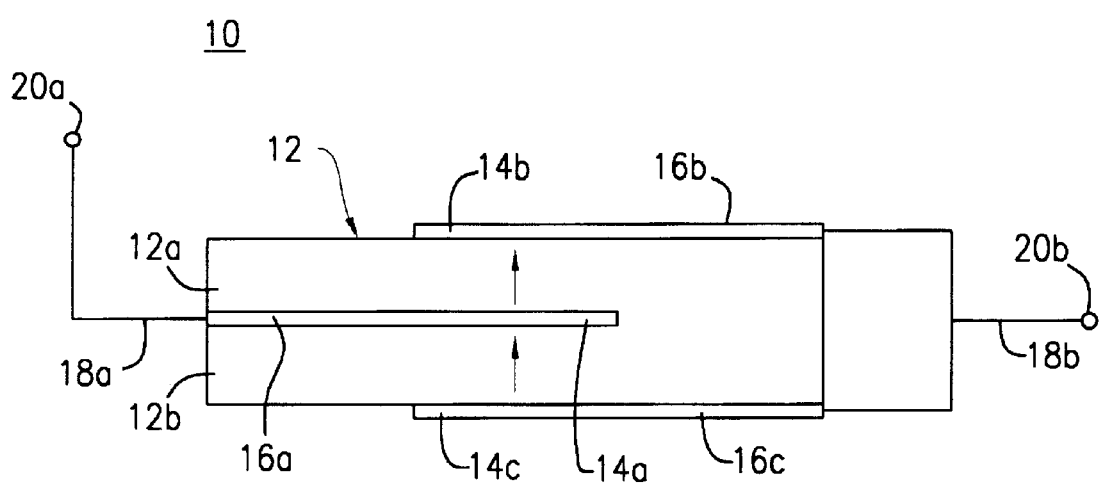
FIG. 4 is a sectional view of the piezoelectric ceramic resonator shown in FIG. 3.

FIG. 3 is a plan view showing an exemplary piezoelectric ceramic resonator according to the present invention, and FIG. 4 is a sectional view showing the same. The piezoelectric ceramic resonator 10 shown in FIGS. 3 and 4 comprises a piezoelectric ceramic device 12 having, for example, a rectangular parallelepiped shape. The piezoelectric ceramic device 12 includes two piezoelectric ceramic layers 12a and 12b. The piezoelectric ceramic layers 12a and 12b comprise the above-mentioned piezoelectric ceramic composition according to the present invention, and are laminated. As shown in FIG. 4, the piezoelectric ceramic layers 12a and 12b are polarized in the same thickness direction indicated by the arrows.

An oscillating electrode 14a having, for example, a circular shape, is disposed between the piezoelectric ceramic layers 12a and 12b, and an extending electrode 16a having, for example, a T shape, extends from the oscillating electrode 14a to one end surface of the piezoelectric ceramic device 12. Another oscillating electrode 14b having, for example, a circular shape, is disposed in the center of the surface of the piezoelectric ceramic device 12a, and another extending electrode 14b having, for example, a T shape, extends from the oscillating electrode 14b to the other end surface of the piezoelectric ceramic device 12. Another oscillating electrode 14c having, for example, a circular shape, is disposed in the center of the surface of the piezoelectric ceramic device 12b, and another extending electrode 16c having, for example, a T-shape, extends from the oscillating electrode 14c to the other end surface of the piezoelectric ceramic device 12.

The extending electrode 16a is connected to one external terminal 20a with a lead wire 18a, and the other extending electrodes 14b and 16c are connected to the other external terminal 20b with another lead wire 18b.

The present invention is applicable to piezoelectric ceramic resonators other than piezoelectric ceramic resonator 10 and applicable to other piezoelectric ceramic elements such as piezoelectric ceramic filters and piezoelectric ceramic oscillators.

What is claimed is:

1. A piezoelectric ceramic composition comprising:
a compound comprising Na, Li, Nb and O and having a perovskite structure, and having a crystal phase which is semi-stable at room temperature and stable at a higher temperature.

2. The piezoelectric ceramic composition according to claim 1, wherein the crystal phase has a monoclinic form.

3. The piezoelectric ceramic composition according to claim 2, wherein the compound is represented by formula $(Na_{1-x}Li_x)NbO_3$, wherein $0.02 \leq x \leq 0.3$.

4. The piezoelectric ceramic composition according to claim 3, wherein $0.08 \leq x \leq 0.18$.

5. The piezoelectric ceramic composition according to claim 2, wherein the compound is represented by formula $$(1-n)[(Na_{1-x}Li_x)_{1-y}K_y](Nb_{1-z}Ta_z)O_3 - nM1M2O_3$$

wherein $0.02 \leq x \leq 0.3$, $0 \leq y \leq 0.2$, $0 \leq z \leq 0.2$, $0 \leq n \leq 0.1$, M1 represents a bivalent metal element and M2 represents a tetravalent metal element.

6. The piezoelectric ceramic composition according to claim 5, wherein the bivalent metal element is at least one element selected from the group consisting of Mg, Ca, Sr and Ba, and the tetravalent metal element is at least one element selected from the group consisting of Ti, Zr, Sn and Hf.

7. The piezoelectric ceramic composition according to claim 5, wherein M1 is Ca or Ba, and M2 is Ti or Zr.

8. The piezoelectric ceramic composition according to claim 7 in combination with at least one electrode.

9. The piezoelectric ceramic composition according to claim 1, wherein the compound is represented by formula $(Na_{1-x}Li_x)NbO_3$, wherein $0.02 \leq x \leq 0.3$.

10. The piezoelectric ceramic composition according to claim 9, wherein $0.08 \leq x \leq 0.18$.

11. The piezoelectric ceramic composition according to claim 1, wherein the compound is represented by formula $$(1-n)[(Na_{1-x}Li_x)_{1-y}K_y](Nb_{1-z}Ta_z)O_3 - nM1M2O_3$$

wherein $0.02 \leq x \leq 0.3$, $0 \leq y \leq 0.2$, $0 \leq z \leq 0.2$, $0 \leq n \leq 0.1$, M1 represents a bivalent metal element and M2 represents a tetravalent metal element.

12. The piezoelectric ceramic composition according to claim 11, wherein the bivalent metal element is at least one element selected from the group consisting of Mg, Ca, Sr and Ba, and the tetravalent metal element is at least one element selected from the group consisting of Ti, Zr, Sn and Hf.

13. The piezoelectric ceramic composition according to claim 11, wherein M1 is Ca or Ba, and M2 is Ti or Zr.

14. The piezoelectric ceramic composition according to claim 13 in combination with at least one electrode.

15. The piezoelectric ceramic composition according to claim 2 in combination with at least one electrode.

16. The piezoelectric ceramic composition according to claim 1 in combination with at least one electrode.

17. A method for manufacturing a piezoelectric ceramic composition according to claim 1, comprising heating a polarized piezoelectric ceramic composition having a crystal phase to a temperature which is equal to or higher than a temperature at which the crystal phase is in a stable state but lower than a temperature at which the compound does not have ferroelectricity.

18. The method for manufacturing a piezoelectric ceramic composition according to claim 17, wherein the temperature to which the polarized piezoelectric ceramic composition is heated is within the range of about 250–400° C.

19. The method for manufacturing a piezoelectric ceramic composition according to claim 18, further comprising polarizing a piezoelectric ceramic composition comprising Na, Li, Nb and O and having a perovskite structure prior to said heating.

20. The method for manufacturing a piezoelectric ceramic composition according to claim 17, further comprising polarizing a piezoelectric ceramic composition comprising Na, Li, Nb and O and having a perovskite structure prior to in said heating.

* * * * *